(12) United States Patent
Feng et al.

(10) Patent No.: US 11,470,714 B2
(45) Date of Patent: Oct. 11, 2022

(54) COMPONENT CARRIER WITH EMBEDDED COMPONENT AND HORIZONTALLY ELONGATED VIA

(71) Applicant: AT&S (China) Co. Ltd., Shanghai (CN)

(72) Inventors: Gin Feng, Shanghai (CN); Sally Sun, Shanghai (CN); Seok Kim Tay, Singapore (SG); Mikael Tuominen, Pernio (FI)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 16/949,010

(22) Filed: Oct. 9, 2020

(65) Prior Publication Data
US 2021/0127478 A1    Apr. 29, 2021

(30) Foreign Application Priority Data

Oct. 23, 2019    (CN) .......................... 201911011874.6

(51) Int. Cl.
*H05K 1/02*     (2006.01)
*H05K 1/11*     (2006.01)
(Continued)

(52) U.S. Cl.
CPC ........... *H05K 1/0206* (2013.01); *H05K 1/116* (2013.01); *H05K 3/0035* (2013.01);
(Continued)

(58) Field of Classification Search
CPC ... H05K 1/02; H05K 1/11; H05K 1/18; H05K 3/32; H05K 3/40; H05K 7/20;
(Continued)

(56) References Cited

U.S. PATENT DOCUMENTS 4,555,151 A * 11/1985 Neese .................... H01R 12/52
                                                     439/82
5,070,529 A * 12/1991 Beaufort .............. H01R 12/716
                                                     361/798
(Continued)

FOREIGN PATENT DOCUMENTS

CN    205902230 U    1/2017
CN    108364921 A    8/2018
(Continued)

OTHER PUBLICATIONS

Tomezak, A; Extended European Search Report in Application No. 20200933.8; pp. 1-9; dated Mar. 15, 2021; European Patent Office; 80298, Munich, Germany.
(Continued)

*Primary Examiner* — Xiaoliang Chen
(74) *Attorney, Agent, or Firm* — Robert A. Blaha; Smith Tempel Blaha LLC (57) ABSTRACT

A component carrier includes a stack with at least one electrically conductive layer structure and at least one electrically insulating layer structure, a component embedded in the stack, and a via formed in the at least one electrically insulating layer structure along a horizontal path having a length being larger than a horizontal width.

19 Claims, 2 Drawing Sheets

(51) Int. Cl.
*H05K 1/18* (2006.01)
*H05K 3/32* (2006.01)
*H05K 3/40* (2006.01)
*H05K 7/20* (2006.01)
*H01L 21/02* (2006.01)
*H01L 21/44* (2006.01)
*H01L 21/48* (2006.01)
*H01L 21/56* (2006.01)
*H01L 21/768* (2006.01)
*H01L 23/00* (2006.01)
*H01L 23/66* (2006.01)
*H01L 23/367* (2006.01)
*H01L 23/498* (2006.01)
*H01L 23/522* (2006.01)
*H01L 23/538* (2006.01)
*H05K 3/00* (2006.01)

(52) U.S. Cl.
CPC . *H05K 3/4069* (2013.01); *H05K 2201/09827* (2013.01); *H05K 2201/10439* (2013.01)

(58) Field of Classification Search
CPC ......... H01L 21/02; H01L 21/44; H01L 21/48; H01L 21/56; H01L 21/768; H01L 23/00; H01L 23/66; H01L 23/367; H01L 23/498; H01L 23/522; H01L 23/538
USPC ......... 174/261, 252, 260, 262; 361/719, 720
See application file for complete search history.

(56) References Cited

U.S. PATENT DOCUMENTS

| | | | |
|---|---|---|---|
| 6,043,986 | A | 3/2000 | Kondo et al. |
| 6,119,338 | A | 9/2000 | Wang et al. |
| 8,908,383 | B1 | 12/2014 | Bantz et al. |
| 9,209,106 | B2 | 12/2015 | Cheung et al. |
| 2003/0054635 | A1 | 3/2003 | Egitto et al. |
| 2004/0112635 | A1 | 6/2004 | Sasaki et al. |
| 2006/0006525 | A1* | 1/2006 | Mullen ................ H05K 1/0206 257/796 |
| 2006/0280410 | A1* | 12/2006 | Fujiwara ............. G02B 6/4292 385/88 |
| 2007/0074904 | A1* | 4/2007 | Kohara ................ H05K 3/0055 174/262 |
| 2009/0288859 | A1 | 11/2009 | Ho et al. |
| 2010/0307809 | A1 | 12/2010 | Noda et al. |
| 2011/0180908 | A1 | 7/2011 | Naganuma et al. |
| 2011/0188224 | A1* | 8/2011 | Sugai ....................... H05K 7/02 361/807 |
| 2011/0269321 | A1* | 11/2011 | Mizoguchi ........... H01R 12/613 439/77 |
| 2012/0026702 | A1* | 2/2012 | Sugai ..................... H05K 3/325 361/752 |
| 2013/0048361 | A1 | 2/2013 | Yamashita et al. |
| 2013/0343000 | A1 | 12/2013 | Cheung et al. |
| 2014/0174793 | A1 | 6/2014 | Oh et al. |
| 2015/0194751 | A1* | 7/2015 | Herring ................ H01R 12/716 439/78 |
| 2016/0227641 | A1 | 8/2016 | Ku et al. |
| 2016/0242287 | A1 | 8/2016 | Takemura et al. |
| 2018/0042114 | A1 | 2/2018 | Furuta et al. |
| 2019/0096814 | A1 | 3/2019 | Wang et al. |

FOREIGN PATENT DOCUMENTS

| | | |
|---|---|---|
| CN | 109392244 A | 2/2019 |
| CN | 109757025 A | 5/2019 |
| JP | 2011061021 A | 3/2011 |
| TW | 200950028 A | 12/2009 |
| WO | 2016081855 A1 | 5/2016 |

OTHER PUBLICATIONS

Office Action in Application No. 201911011874.6, pp. 1-9; dated Mar. 31, 2022; China National Intellectual Property Administration; No. 6, Xitucheng Lu, Jimenqiao Haidian District, Beijing City, 100088, China.

English Translation of Cover pages of Office Action in Application No. 201911011874.6, pp. 1-3; dated Mar. 31, 2022; China National Intellectual Property Administration; No. 6, Xitucheng Lu, Jimenqiao Haidian District, Beijing City, 100088, China.

* cited by examiner

COMPONENT CARRIER WITH EMBEDDED COMPONENT AND HORIZONTALLY ELONGATED VIA

TECHNICAL FIELD

The invention relates to a component carrier with a horizontally elongated via and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently embed a component in the component carrier.

SUMMARY

There may be a need for a component carrier allowing to efficiently embed a component in the component carrier.

According to an exemplary embodiment of the invention, a component carrier is provided, wherein the component carrier includes a stack with at least one electrically conductive layer structure and at least one electrically insulating layer structure, a component embedded in the stack, and a via formed in the at least one electrically insulating layer structure along a horizontal path having a length being larger than a horizontal width (wherein the length direction and the width direction may extend within a horizontal plane and perpendicular to each other).

According to another exemplary embodiment of the invention, a method of manufacturing a component carrier is provided, wherein the method includes providing a stack with at least one electrically conductive layer structure and at least one electrically insulating layer structure, embedding a component in the stack, forming a via in the at least one electrically insulating layer structure along a horizontal path having a length being larger than a horizontal width, and optionally at least partly filling the via with an electrically conductive filling to thereby electrically contact the embedded component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "stack" may particularly denote an arrangement of multiple planar layer structures which are mounted in parallel on top of one another.

In the context of the present application, the term "component" may particularly denote any inlay to be integrated in a cavity of a component carrier stack. Said inlay may fulfill an electric function and can be connected to one or more electrically conductive layer structures of the stack via its one or more pads.

In the context of the present application, the term "via" may particularly denote a hole extending through at least part of the layer structures of the stack, and which may be formed in particular and preferably by laser processing. Thus, the via may be a laser via. A via may be manufactured for instance by a single laser shot or by a combination of laser shots from the front side and the back side, i.e., from the two opposing main surfaces of, the layer structures. One or more laser shots may be carried out from each of these sides. Formation of a via by laser processing from only one main surface may be possible as well. Furthermore, formation of a via may be carried out as well by other methods than laser processing, for instance by a plasma treatment.

According to an exemplary embodiment of the invention, a component carrier is provided which has at least one via extending in an elongate way in a horizontal plane. Advantageously, such a component carrier may be manufactured with standard PCB manufacturing equipment, and may in particular involve a laser direct drilling and optionally a copper plating procedure. A component carrier according to an embodiment of the invention may combine a highly efficient thermal management with a thin PCB design and a reliable electric performance of an embedded component.

Next, further exemplary embodiments of the component carrier and the method will be explained.

In an embodiment, the via is at least partially filled with an electrically conductive filling which electrically contacts the embedded component. In the context of the present application, the term "electrically conductive filling" may particularly denote a metal, for instance copper, filling at least part of the via. The electrically conductive filling may be formed by one or more filling procedures, such as electroless deposition, one or multiple plating procedures, etc. Said at least one via may be filled with an electrically conductive material such as copper and may be configured for providing a low ohmic electrical contact for electrically connecting an embedded component. Simultaneously, the electrically conductive filling of the via may contribute to the removal of heat during operation of the component carrier with embedded component. An embodiment thus provides an efficient solution for a printed circuit board (PCB) designer for improved electric and thermal management of an embedded component. Descriptively speaking, a horizontally elongated via filled with electrically conductive filling medium may be provided to simply electrically connect an embedded component while also improving the thermal performance.

In another embodiment, the via is not filled with an electrically conductive filling. Thus, it is also possible to provide a component carrier with empty via slots or vias not filled with conductive material. Such a feature can be especially used to thermally decouple two surfaces on each side of such unfilled laser slot configuration In an embodiment, the via is a laser via formed by laser drilling. For instance, laser drilling may be done only from one side of the stack, or from both opposing main surfaces thereof.

In an embodiment, the via has tapering sidewalls in a depth direction (which may be perpendicular to the length direction and the width direction). In particular, all sidewalls of the via may be tapering towards an interior of the stack. Slanted sidewalls may contribute to a heat spreading function. Alternatively, the via may have vertical sidewalls in a depth direction.

In an embodiment, the via is substantially bathtub shaped. In particular, the bathtub shaped via may be formed with tapering sidewalls in a plan view along both perpendicular horizontal directions.

In an embodiment, the via is substantially W-shaped. Such a via may be formed for instance by two laser shots generating conical holes connecting to form a W-shaped via in a cross-sectional view.

In an embodiment, the component embedded in the stack may be contacted by or connected with the via. In particular, the embedded component may be contacted by or connected with a plurality of (for instance slot-shaped) vias having the described features. This may further improve the electric coupling performance and the heat removal capability.

In an embodiment, multiple (for instance slot-shaped) vias having the described features are provided in a vertically stacked arrangement. Therefore, even a long thermal path from the component in an interior of the component carrier up to its exterior main surfaces may be established by the electric and/or thermal vias for further increasing efficiency of heat removal and electric conductance.

In an embodiment, the via is configured for thermally conducting heat out of the component carrier. Such heat may be generated for instance by an embedded component, such as a semiconductor chip like a microprocessor, during operation of the component carrier.

In an embodiment, the via is configured for electrically conducting current and/or signals within the component carrier. Thus, in addition to its thermal function, the metal filled via for example may also contribute to the electric connection in an interior of the component carrier.

In an embodiment, the via has the shape of an oblong slot with straight shape along its length. Such a structure may be manufactured easily by laser drilling.

In an embodiment, the via has a curved shape. For instance, the via may have a circular segment, may be shaped like a ring, etc.

In an embodiment, a ratio between length and width of the via within a horizontal plane is in a range between 1.5 and 5. Hence, the via may be oblong to thereby significantly increase the thermal performance.

In an embodiment, a ratio between depth (in vertical direction) and width (in the horizontal plane) of the via is in a range between 10% and 90%. Thus, the via may be formed with a small aspect ratio rendering the space consumption in a vertical direction small.

In an embodiment, the via is formed by opening an electrically conductive layer structure above an electrically insulating layer structure by etching a window and subsequently removing exposed electrically insulating material by (in particular low energy) laser processing. Thus, opening the window in a copper foil may be accomplished also with a laser beam.

In an embodiment, the via is formed by (in particular high energy) laser processing (in particular without previous window formation). Thus, both window formation and formation of a hole in the electrically insulating layer structure for forming the via may be accomplished by laser processing.

In an embodiment, a laser source, which may be operated for continuously emitting a laser beam, moves during forming the via relative to the electrically insulating layer structure. As a result, the continuous trajectory of the laser source may translate in an intuitive way into a continuous trajectory of the laser via in the horizontal plane.

In another embodiment, the laser source moves only between forming different laser shots in adjacent (for instance overlapping) surface portions of the electrically insulating layer structure and is stationary with respect to the electrically insulating layer structure during each individual laser shot. Descriptively speaking, the laser source may produce a sequence of frustoconical holes which connect to form the elongated via.

In an embodiment, the via is configured as a thermal via and is at least partially filled with a thermally conductive filling. In the context of the present application, the term "thermal via" may particularly denote a via being configured for and being filled with a thermally conductive filling medium for being capable of removing heat generated by the component carrier during operation. In the context of the present application, the term "thermally conductive filling" may particularly denote a metal, for instance copper, filling at least part of the via. The thermally conductive filling may be formed by one or more filling procedures, such as electroless deposition, one or multiple plating procedures, etc. The thermally conductive filling may or may not be also electrically conductive. For instance, the thermally conductive filling medium may have a thermal conductivity of at least 10 W/mK, in particular at least 50 W/mK. According to such an embodiment, a component carrier is provided which has at least one via extending in an elongate way in a horizontal plane and being filled with a thermally conductive material such as copper. Such a thermal via may be configured for removing heat out of the component carrier during operation thereof. For instance, such heat may be generated by ohmic loss when electric signals propagate along electrically conductive layer structures of the component carrier. An embodiment thus provides an efficient solution for a printed circuit board (PCB) designer for improved thermal management. Advantageously, such a component carrier may be manufactured with standard PCB manufacturing equipment, and may in particular involve a laser direct drilling process for creating the via and a copper plating procedure for filling the via with thermally conductive material. A component carrier according to an exemplary embodiment of the invention may combine a highly efficient thermal management with a thin design. Descriptively speaking, a horizontally elongated thermal via may provide a high thermal contribution with low effort and low space consumption. For instance, a slotted via filled with thermally conductive material may provide a better heat removal performance compared to multiple individual circular vias.

In an embodiment, the thermal via is electrically inactive. Thus, the thermal via may be arranged in the component carrier so as to be decoupled from any electric current flow.

In such an embodiment, the thermal via may be specifically configured exclusively for thermal management.

In an embodiment, the via extends in a vertical direction from a horizontally extending trace. Thus, the via may also contribute to heat removal from an electrically conductive trace carrying an electric current creating ohmic losses.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the present invention are apparent from the examples of embodiment to be described hereinafter and are explained with reference to the examples of embodiment. Exemplary embodiments of the invention will be described in more detail hereinafter with reference to examples of embodiment but to which the scope of the invention is not limited.

DETAILED DESCRIPTION OF THE ILLUSTRATED EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features which have already been elucidated with respect to a previously described embodiment may not be elucidated again at a later position of the description.

Further, spatially relative terms, such as "front" and "back", "above" and "below", "left" and "right", et cetera are used to describe an element's relationship to other element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different from those illustrated in the figures when in use.

Before, referring to the drawings, exemplary embodiments will be described in further detail, some basic considerations will be summarized based on which exemplary embodiments of the invention have been developed.

According to an embodiment of the invention, a component carrier with low-ohmic and thus low-loss electric connection of an embedded component may be provided which is based on a blind micro slot via design, the via being filled with an electrically conductive (and preferably also thermally conductive) material such as copper. The latter may be manufactured for instance by a laser direct drill process. Such a blind micro slot via has more contact surface area than a combination of two conventional vias for the same hole size, which allows better electric connection and heat removal of the embedded component. The blind micro slot via can be produced by a laser direct drill process making use of a laser drill machine without the necessity to make any specific adaptations. A correspondingly manufactured component carrier shows a pronounced electric reliability of the embedded component. Any layer design PCB is possible according to exemplary embodiments of the invention.

According to an exemplary embodiment of the invention, large area copper connections can be formed with a high capability of thermal dissipation for functional dies being embedded in inner layers of a component carrier. Simultaneously, this can be accomplished with low space consumption.

Exemplary embodiments provide a connection between embedded functional dies and outer layers which provide not only outstanding electric connectivity but also a high ability of thermal dissipation with accurate alignment and variable connection area. A remarkably high ability of thermal dissipation may thus be synergistically combined with an accurate alignment via the connection area.

Figures 1, 2, 3, 4, 5, 6, 7:
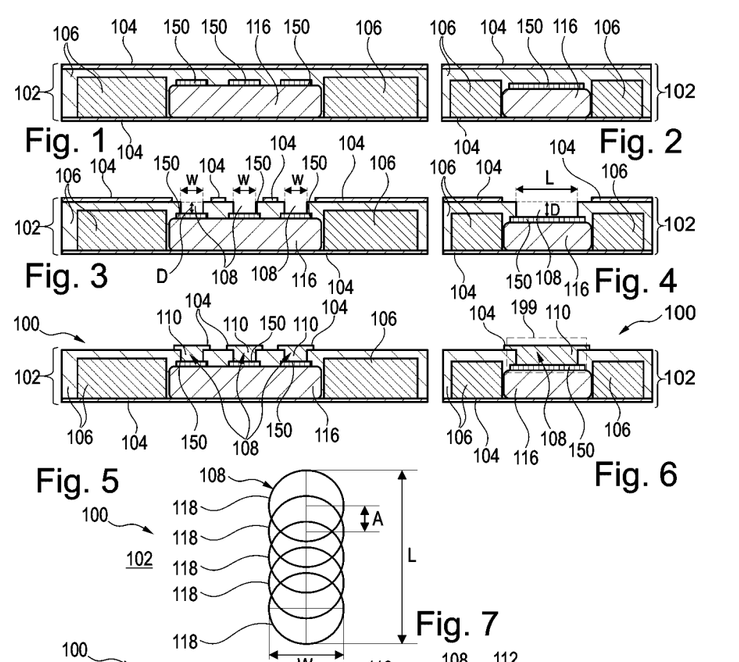
FIG. 1 illustrates a lengthwise cross-sectional view and FIG. 2 illustrates a lateral cross-sectional view of a structure obtained during manufacturing a component carrier according to an embodiment of the invention with oblong copper filled laser via.
FIG. 3 illustrates a lengthwise cross-sectional view and FIG. 4 illustrates a lateral cross-sectional view of a structure obtained during manufacturing a component carrier according to FIG. 1 and FIG. 2.
FIG. 5 illustrates a lengthwise cross-sectional view and FIG. 6 illustrates a lateral cross-sectional view of a component carrier obtained by manufacturing according to FIG. 1 to FIG. 4.
FIG. 7 illustrates a plan view of an oblong slot-shaped copper-filled laser via of a component carrier according to an exemplary embodiment of the invention.

FIG. 1 illustrates a lengthwise cross-sectional view and FIG. 2 illustrates a lateral cross-sectional view of a structure obtained during manufacturing a component carrier 100 according to an embodiment of the invention with oblong copper filled laser via 108.

As shown in FIG. 1, a component 116 is embedded in a stack 102 of layer structures 104, 106. The component 116, for instance embodied as a semiconductor chip, is provided with pads 150 on its top side.

The stack 102 may be a plate shaped laminate type layer stack composed of one or more electrically conductive layer structures 104 and one or more electrically insulating layer structures 106. For example, the electrically conductive layer structures 104 may comprise patterned copper foils and vertical through connections, for example copper filled laser vias. The electrically insulating layer structures 106 may comprise a resin (such as epoxy resin) and optionally reinforcing particles therein (for instance glass fibers or glass spheres). For instance, the electrically insulating layer structures 106 may be made of FR4 or ABF. In the shown embodiment, the thick central electrically insulating layer structure 106 may be a fully cured core.

A cavity may be defined by a through-hole in the stack 102 which may be closed on a bottom side by attaching a temporary carrier (not shown) to a lower main surface of the stack 102. The temporary carrier may for instance be a sticky tape. The component 116 may be attached with a main surface opposing to the upwardly oriented pads 150 with direct physical contact on the temporary carrier in the cavity. The function of the temporary carrier is to provide stability until the component 116 is glued in place within the cavity.

Referring to FIG. 1, the component 116 has been embedded in the stack 102 and has been glued in place by lamination. More specifically, the structure shown in FIG. 1 can be obtained by laminating one or more further electrically insulating layer structures 106 and one or more further electrically conductive layer structures 104 to the upper main surface of the stack 102 with the component 116 in the cavity. For instance, a prepreg layer (as further electrically insulating layer structure 106) and a copper foil (as further electrically conductive layer structure 104) may be laminated on top of the component 116 and the stack 102. During the lamination process, uncured material of the further electrically insulating layer structure 106 may become flowable or melt and may flow in gaps between stack 102, temporary carrier and component 116. Upon curing (for instance cross-linking, polymerizing, etc.) of the material of the further electrically insulating layer structure 106, the filling medium in said gaps may become solid. A resin coated copper (RCC) may also be used for lamination on the top side of the component 116 and the stack 102. As an alternative to the described lamination, it is also possible to glue component 116 in place in the cavity formed in stack 102 by filling liquid adhesive material in the gaps in between (not shown). Upon curing said adhesive material, the component 116 is again glued in place in the cavity.

After that, the temporary carrier may be removed. When the temporary carrier is a sticky tape, it may be simply peeled off from the lower main surface of the structure shown in FIG. 1 and FIG. 2.

Hence, FIG. 1 and FIG. 2 show a functional die in form of component 116 embedded in the stack 102. Gaps are filled-up with cured material of a resin sheet.

FIG. 3 illustrates a lengthwise cross-sectional view and FIG. 4 illustrates a lateral cross-sectional view of a structure obtained during manufacturing a component carrier 100 according to FIG. 1 and FIG. 2.

The structure shown in FIG. 3 and FIG. 4 may be obtained by lithographically etching the previously continuous electrically conductive layer structure 104 on top of the structure according to FIG. 1 and FIG. 2. As a result, a patterned electrically conductive layer structure 104 is shown on top of FIG. 3 and FIG. 4. Subsequently, it may be possible to remove material of the thereby exposed electrically insulating layer structure 106 by laser drilling, to thereby expose the pads 150 of the embedded component 116. Thus, it may be possible to make the shown opening(s) in the top electrically conductive layer structure 104 with a conformal mask process and to drill slots in the beneath electrically insulating layer structure 106 by a $CO_2$ laser, to thereby obtain three parallel slot-shaped oblong vias 108.

Thus, slotted vias 108 are formed in the electrically insulating layer structure 106 along a horizontal path having a length L (see FIG. 4) being larger than a horizontal width W (see FIG. 3). The slotted vias 108 may have vertical or tapering sidewalls in a depth D direction perpendicular to the horizontal plane. As shown, the vias 108 have a shape of an oblong slot with straight shape along its length L. A ratio between length L and width W of the via 108 may be in a range between 1.5 and 5. A ratio between depth D and width W of the via 108 may be in a range between 10% and 90%.

FIG. 5 illustrates a lengthwise cross-sectional view and FIG. 6 illustrates a lateral cross-sectional view of a component carrier 100 obtained by manufacturing according to FIG. 1 to FIG. 4.

As shown, it is then possible to fill-up the slot shaped vias 108 with an electrically conductive filling 110, for instance with copper. For example, this may be done with electroless plating, galvanic plating, etc. Thereafter, it is possible to etch exterior pads for designing outer layers.

As a result, the illustrated component carrier 100 according to an embodiment of the invention is obtained. Said component carrier 100 comprises stack 102 comprising electrically conductive layer structures 104 and electrically insulating layer structures 106. Component 116 is embedded in the stack 102.

The vias 108 are filled with electrically and thermally conductive filling 110 which electrically contacts the embedded component 116 and removes heat generated by the component 116 during operation of the component carrier 100. The component 116 being embedded in the stack 102 may be electrically contacted by the vias 108 which may simultaneously function for removing and/or spreading heat. In other words, the vias 108 may be configured for thermally conducting heat out of the component carrier 100 and for electrically conducting current and/or signals within the component carrier 100.

As described, the via 108 may be formed by laser drilling. The vias 108 may have vertical sidewalls, but may also have tapering sidewalls 112 (compare FIG. 8 and FIG. 9). It is also possible that a plurality of vias 108 having the described features are provided in a vertically stacked arrangement (not shown).

FIG. 7 illustrates a plan view of an oblong copper filled laser via 108 of a component carrier 100 according to an exemplary embodiment of the invention.

According to FIG. 7, the via 108 is formed as a straight sequence of laser shots in adjacent surface portions of the electrically insulating layer structure 106 of stack 102 to thereby form integrally connected circular recesses 118 constituting the via 108. Each laser shot may form a frustoconical hole. Thus, in the illustrated plan view, the via 108 has an outline defined by the plurality of longitudinally aligned circular recesses 118. Descriptively speaking, the circles of the individual laser shots may overlap to form a straight oblong via 108 with wave-shaped side trajectory. Thus, each of the slot-type vias 108 may be composed of multiple overlapping laser holes filled with copper.

Referring to FIG. 7, "W" denotes the width or diameter of the laser holes. It is possible to control a partial exposure of conformal mask to get a highly accurate alignment. "A" denotes the pitch size (i.e., the holes' center to center distance). The pitch size may lead to the shape of the slot and its current carrying and removal capacity as well. "L" denotes the length of the slot.

Figure 8:
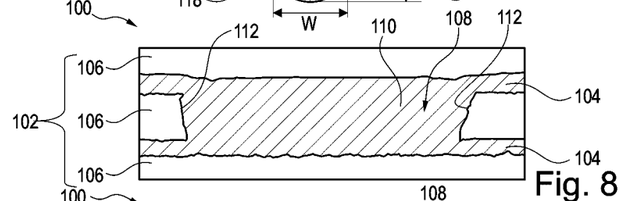
FIG. 8 and FIG. 9 illustrate images of a part of a component carrier according to an embodiment of the invention with oblong copper filled laser via.
Figure 9:
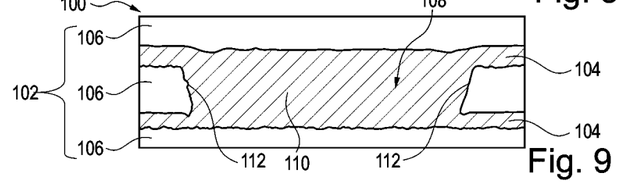

FIG. 8 and FIG. 9 illustrate images of a part of a component carrier 100 according to an embodiment of the invention with oblong copper filled laser via 108. After $CO_2$ laser drilling, the slots may be filled through PLB and via filling. Said images correspond to a component carrier region indicated in FIG. 6 with a box 199. For instance, the vias 108 may be substantially bathtub shaped.

Also, in each of the following embodiments, it is possible that a component 116 is embedded in a stack 102 and is contacted by a via 108 and/or by a trace 151.

Figure 10:
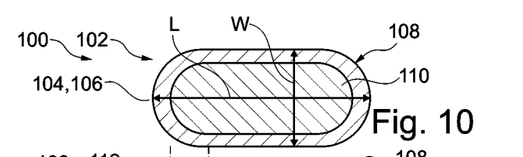
FIG. 10 illustrates a plan view and FIG. 11 illustrates a cross-sectional view of a component carrier according to an exemplary embodiment of the invention with oblong copper filled laser via.
Figure 11:
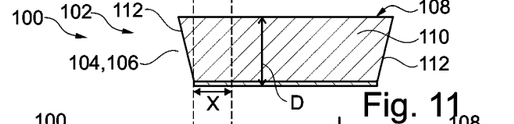

FIG. 10 illustrates a plan view and FIG. 11 illustrates a cross-sectional view of a component carrier 100 according to an exemplary embodiment of the invention with oblong copper filled laser via 108.

A thermal via 108 is formed as a blind hole in one of the electrically insulating layer structures 106 along a horizontal path, i.e., along a path within a horizontal plane of the component carrier 100. The thermal via 108 has a length L in the horizontal plane being larger than a horizontal width W in the horizontal plane, and has tapering sidewalls 112 in a depth D direction (perpendicular to width direction and length direction). Moreover, the thermal via 108 is filled with a thermally conductive filling 110 such as copper. The via 108 filled with the thermally conductive filling 110 is configured for thermally conducting heat out of the component carrier 100. Additionally, the via 108 may be configured for electrically conducting current and/or signals within the component carrier 100. The via 108 is a laser via formed by laser drilling. As shown in particular in FIG. 2, the via 108 is substantially bathtub shaped. As shown in particular in FIG. 1, the via 108 has a shape of an oblong slot with substantially straight shape along its length L. Alternatively, the via 108 may have a curved shape within the horizontal plane (not shown). A ratio between length L and width W of the via 108 may be in a range between 1.5 and 5. Furthermore, a ratio between depth D and width W of the via 108 may be in a range between 10% and 90%.

For instance, the via 108 may be formed along a continuous trajectory by a moving laser source or as a sequence of laser shots in adjacent surface portions of the electrically insulating layer structure 106 to thereby form integrally connected circular recesses constituting the via 108.

The blind micro slot via 108 may have a dimension of 100 μm with 80% of the via bottom being capable to provide 15027 μm$^2$ of contact area (when dimension "X" is 40 μm). This may be about 50% more than a conventional blind micro via.

Figure 12:
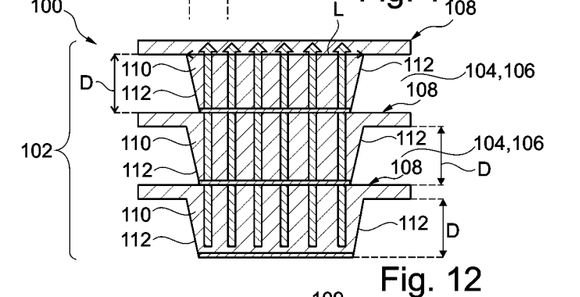
FIG. 12 illustrates a cross-sectional view of a component carrier according to an exemplary embodiment of the invention with stacked oblong copper filled laser vias.

FIG. 12 illustrates a cross-sectional view of a component carrier 100 according to an exemplary embodiment of the invention with stacked oblong copper filled laser vias 108.

More specifically, FIG. 12 shows a plurality of vias 108 having the described features and being provided in a vertically stacked arrangement. By taking this measure, a larger contact area and thus an increased heat transfer capability may be obtained. The heat removal function is illustrated by arrows in FIG. 12.

Figure 13:
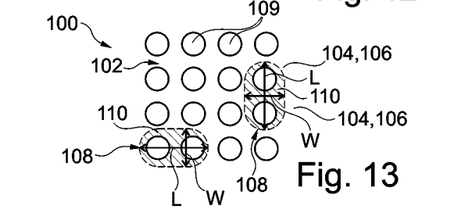
FIG. 13 illustrates a plan view of a component carrier according to an exemplary embodiment of the invention with oblong copper filled laser vias.

FIG. 13 illustrates a plan view of a component carrier 100 according to an exemplary embodiment of the invention with oblong copper filled laser vias 108. FIG. 13 compares a horizontally aligned and a vertically aligned oblong straight via 108 according to an exemplary embodiment with a conventional array of vias 109 with circular cross-section.

As shown, the vias 108 of the illustrated exemplary embodiment form a high via density area. Descriptively speaking, it is possible to combine two conventional vias 109 into one via 108. This allows to obtain an enhanced thermal transfer capacity without additional spacing.

Figure 14:
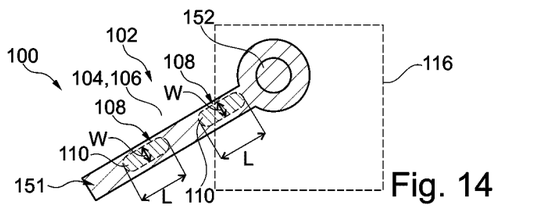
FIG. 14 illustrates a plan view of a component carrier according to an exemplary embodiment of the invention with electrically conductive trace having integrated oblong copper filled laser vias.

FIG. 14 illustrates a plan view of a component carrier 100 according to an exemplary embodiment of the invention with an electrically conductive trace 151 having integrated oblong copper filled laser vias 108. The electrically conductive trace 151 is connected with a vertically extending land pad 152 and is configured for conducting electric power or an electric signal. The elongate thermal vias 108 being integrally formed with the electrically conductive trace 151 boost the heat removal function of the component carrier 100. Thus, thermal vias 108 with horizontally elongated trajectory may be formed within the trace 151. More specifically, the thermal vias 108 can be drilled within the trace 151. This renders it possible to obtain a better heat transfer without any additional spacing requirement.

It should be noted that the term "comprising" does not exclude other elements or steps and the article "a" or "an" does not exclude a plurality. Also, elements described in association with different embodiments may be combined.

Implementation of an embodiment of the invention is not limited to the preferred embodiments shown in the figures and described above. Instead, a multiplicity of variants is possible which use the solutions shown and the principle according to an embodiment of the invention even in the case of fundamentally different embodiments.

The invention claimed is:

1. A component carrier, comprising:
a stack comprising at least one electrically conductive layer structure and at least one electrically insulating layer structure;
a component embedded in the stack, wherein the component comprises at least one pad on a main surface of the component; and
a via formed in at least one of the at least one electrically insulating layer structure along a horizontal path having a length being larger than a horizontal width,
wherein the via is configured as a thermal via and is at least partially filled with a thermally conductive filling; and
wherein the via directly contacts the at least one pad,
wherein the component carrier comprises an electrically conductive trace having oblong filled layer vias, wherein the electrically conductive trace is connected with a vertically extending land pad.

2. The component carrier according to claim 1, wherein the via is at least partially filled with an electrically conductive filling which electrically contacts the embedded component.

3. The component carrier according to claim 1, wherein the via is not filled with an electrically conductive filling.

4. The component carrier according to claim 1, wherein the via is a laser via formed by laser drilling.

5. The component carrier according to claim 1, wherein the via has tapering sidewalls in a depth direction.

6. The component carrier according to claim 1, wherein the via is formed with vertical sidewalls in a depth direction.

7. The component carrier according to claim 1, wherein the via is substantially bathtub shaped.

8. The component carrier according to claim 1, wherein the component is connected with or contacted by a plurality of vias each formed in at least one of the at least one electrically insulating layer structure along a horizontal path having a length being larger than a horizontal width.

9. The component carrier according to claim 8, wherein each via is at least partially filled with an electrically conductive filling.

10. The component carrier according to claim 1, comprising at least one of the following features:
wherein a plurality of vias is provided in a vertically stacked arrangement, each via formed in at least one of the at least one electrically insulating layer structure along a horizontal path having a length being larger than a horizontal width, wherein each via is at least partially filled with an electrically conductive filling;
wherein the via is configured for thermally conducting heat out of the component carrier;
wherein the via is configured for electrically conducting current and/or signals within the component carrier;
wherein the via is formed as a sequence of frustoconical holes in adjacent surface portions of at least one of the at least one electrically insulating layer structure to thereby form connected circular recesses constituting the via;
wherein the via has a shape of an oblong slot with straight shape along its length;
wherein the via has a curved shape;
wherein a ratio between length and width of the via is in a range between 1.5 and 5;
wherein a ratio between a depth and the width of the via is in a range between 10% and 90%;
wherein, in a plan view, the via has an outline defined by a plurality of longitudinally arranged overlapping circular recesses;
wherein the thermal via is electrically inactive.

11. The component carrier according to claim 1, comprising at least one of the following features:
the component is selected from a group consisting of an electronic component, an electrically non-conductive and/or electrically conductive inlay, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein the at least one electrically conductive layer structure comprises at least one of the group consisting of copper, aluminum, nickel, silver, gold, palladium, and tungsten;
wherein the at least one electrically insulating layer structure comprises at least one of the group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
wherein the component carrier is shaped as a plate;
wherein the component carrier is configured as one of the group consisting of a printed circuit board, a substrate, and an interposer;
wherein the component carrier is configured as a laminate-type component carrier.

12. A method of manufacturing a component carrier, the method comprising:
providing a stack comprising at least one electrically conductive layer structure and at least one electrically insulating layer structure;
embedding a component in the stack, wherein the component comprises at least one pad on a main surface of the component; and
forming a via in at least one of the at least one electrically insulating layer structure along a horizontal path having a length being larger than a horizontal width,
wherein the via is configured as a thermal via and is at least partially filled with a thermally conductive filling; and
wherein the via directly contacts the at least one pad,
wherein the component carrier comprises an electrically conductive trace having oblong filled layer vias, wherein the electrically conductive trace is connected with a vertically extending land pad.

13. The method according to claim 12, wherein the method comprises forming the via by laser drilling.

14. The method according to claim 12, wherein the method comprises using the via for thermally conducting heat out of the component carrier.

15. The method according to claim 12, wherein the method comprises using the via for conducting electric current and/or signals within the component carrier.

16. The method according to claim 12, wherein the method comprises forming the via by:

opening an electrically conductive layer structure above an electrically insulating layer structure of the stack by etching a window in the electrically conductive layer structure and subsequently removing exposed material of the electrically insulating layer structure by laser processing.

17. The method according to claim 12, wherein the method comprises forming the via by:
operating a laser source for continuously emitting a laser beam, and
moving the laser beam relative to the electrically insulating layer structure during forming the via.

18. The method according to claim 12, wherein the method comprises forming the via by:
operating a laser source for moving with respect to the electrically insulating layer structure only between emitting different laser shots in overlapping, surface portions of the electrically insulating layer structure, and
operating the laser source to be stationary with respect to the electrically insulating layer structure during each individual laser shot.

19. The method according to claim 12, wherein the method comprises electrically and/or thermally contacting or connecting the embedded component by the via.

* * * * *